United States Patent [19]
Rush et al.

[11] Patent Number: 5,815,100
[45] Date of Patent: Sep. 29, 1998

[54] VOLTAGE MULTIPLEXED CHIP I/O FOR MULTI-CHIP MODULES

[75] Inventors: Kenneth Rush; Eldon Cornish; Steve Draving, all of Colorado Springs, Colo.

[73] Assignee: Hewlett-Packard Company, Palo Alto, Calif.

[21] Appl. No.: 657,987

[22] Filed: Jun. 4, 1996

[51] Int. Cl.[6] .................................................. H03M 1/00
[52] U.S. Cl. ............................................................ 341/410
[58] Field of Search .................................. 341/110, 137, 341/143, 155

[56] References Cited

U.S. PATENT DOCUMENTS

| | | | |
|---|---|---|---|
| 4,038,564 | 7/1977 | Hakata | 307/205 |
| 4,620,188 | 10/1986 | Sengchanh | 340/825.87 |
| 4,631,428 | 12/1986 | Grimes | 307/475 |
| 4,682,052 | 7/1987 | Kyomasu | 307/361 |
| 5,191,242 | 3/1993 | Agrawal et al. | 307/465 |
| 5,450,023 | 9/1995 | Yang et al. | 326/60 |
| 5,457,411 | 10/1995 | Hastings | 326/59 |

FOREIGN PATENT DOCUMENTS

| | | | |
|---|---|---|---|
| 3331572 C2 | 11/1985 | Germany . | |
| WO94/23389 | 10/1994 | WIPO | G06F 15/60 |

OTHER PUBLICATIONS

"Self–Timed Simultaneous Bidirectional Signalling for IC Systems"; GY Yacoub and WH Ku; IEEE (1992).
"A 900 Mb/s Bidirectional Signaling Scheme"; Randy Mooney, Charles Dike and Shekhar Borkar; IEEE; vol. 30 No. 12; Dec. 1995.
"FPGA '94 2nd International ACM/SIGDA Workshop on Field–Programmable Gate Arrays"; Russell Tessier et al.; Feb. 13–15, 1994.
"IEEE Workshop on FPGAs for Custon Computing Machines"; Jonathan Babb et al. IEE Computer Society Press, Apr. 5–7, 1993.

Primary Examiner—Brian K. Young

[57] ABSTRACT

An electrical interconnect between a plurality of output nodes of a first integrated circuit (IC) and a plurality of input nodes of a second IC, the interconnect. A first bond pad located on the first integrated circuit is coupled to the output nodes. A second bond pad located on the second integrated circuit is coupled to the input nodes. A first digital-to-analog converter located on the first integrated circuit and having an output coupled to the first bond pad receives a plurality of binary inputs from the output nodes of the first integrated circuit. A first analog-to-digital converter is located on the second integrated circuit and coupled to the second bond pad and has an output line coupled to each of the plurality of input nodes of the second IC.

13 Claims, 6 Drawing Sheets

VOLTAGE MULTIPLEXED CHIP I/O FOR MULTI-CHIP MODULES

BACKGROUND OF THE INVENTION

1. Field of the Invention

The present invention relates, in general, to multi-chip modules, and, more particularly, to voltage multiplexed connections between chips in a multi-chip module.

2. Statement of the Problem

As integrated circuits processing technology improves, more and more devices and functions can be integrated onto a single chip. However, this creates a need for increasing numbers of electrical connections to the integrated circuit. Today, the most common method of making the electrical connection between the IC and the package is by wire bonding. Wire bonds are located at the perimeter of the IC at a minimal pitch limited by the state of the art wire bonding machinery. Electrical connections made inside the IC can be formed at much smaller geometries than is supported by the wire bonding machinery. Hence, the number of wire bonds at the chip perimeter has not kept pace with the increasing demand for electrical connections created by the improvements in semiconductor processing. Moreover, it is unlikely that improvements in wire bonding technology will ever keep pace with the need for electrical connections.

Making interconnections between integrated circuits is a particular problem in multi-chip modules where space is at a premium and the need for wide bandwidth electrical connections between chips is great. This is even more true in "scaleable" technologies that provide increased performance by providing arrays of similar type integrated circuits. Examples of scaleable technologies include programmable logic devices such as programmable gate arrays (PGAs), programmable logic arrays (PLAs), field programmable gate arrays (FPGAs), and the like.

Proposed solutions include making larger chip perimeters to support a larger number of interconnects. However, this is not an efficient use of silicon and results in increased costs that are usually unacceptable. Other proposals suggest using bond pads distributed throughout the body of the IC. However, a practical technology for making reliable interconnections to the chip interior are not widely known.

Another proposed solution is to expand the data carrying capacity of each wire used to connect each internal node to a bond pad on the chip perimeter. G. Y. Yacoub et al. propose in a paper entitled "Self-Timed Simultaneous Bi-directional Signaling for IC Systems" (IEEE 1992) that three voltage levels can be used to enable bi-directional data transfer over a single wire. A similar approach is discussed by Mooney et al. in "A 900 Mb/s Bi-directional Signaling Scheme" appearing in the *IEEE Journal of Solid-State Circuits* Vol. 30, No 12 (December, 1995). These systems require high tolerance component matching in the integrated circuits and careful matching of resistances between adjacent chips to provide adequate noise margin between the three voltage levels.

Another method of reducing the number of interconnects is to increase the frequency of the data transmitted on each wire. This is straight forward to implement using time multiplexing techniques, but increases the complexity of the system. Further, the problem of programming a programmable logic device using time multiplexed interconnects is extremely complex and not commercially available.

Data compression and multiplexing methods are known and widely used in the fields of communication and digital data storage. For example, current modem technology allows data transmission over a long pair of telephone wire at 28.8 thousand bits per second or more using compression and multiplexing. However, it is not practical to provide the modem functionality for every pin of an integrated circuit. Further, integrated circuit pins are required to carry data at rates several orders of magnitude higher than conventional modems.

These prior attempts to increase the data capacity of wires in an integrated circuit suffer from complexity of circuit design and/or noise sensitivity. A need exists for an easily implemented technology that enables a limited number of interconnect wires coupled to an integrated circuit to carry increasing amounts of data.

SUMMARY OF THE INVENTION

Briefly stated, these and other problems of conventional chip interconnects are solved by an electrical interconnect between a plurality of output nodes of a first integrated circuit (IC) and a plurality of input nodes of a second IC, the interconnect. A first bond pad located on the first integrated circuit is coupled to the output nodes. A second bond pad located on the second integrated circuit is coupled to the input nodes. A first digital-to-analog converter located on the first integrated circuit and having an output coupled to the first bond pad receives a plurality of binary inputs from the output nodes of the first integrated circuit. A first analog-to-digital converter is located on the second integrated circuit and coupled to the second bond pad and has an output line coupled to each of the plurality of input nodes of the second IC.

DETAILED DESCRIPTION OF THE DRAWING

1. Overview

Figure 1:
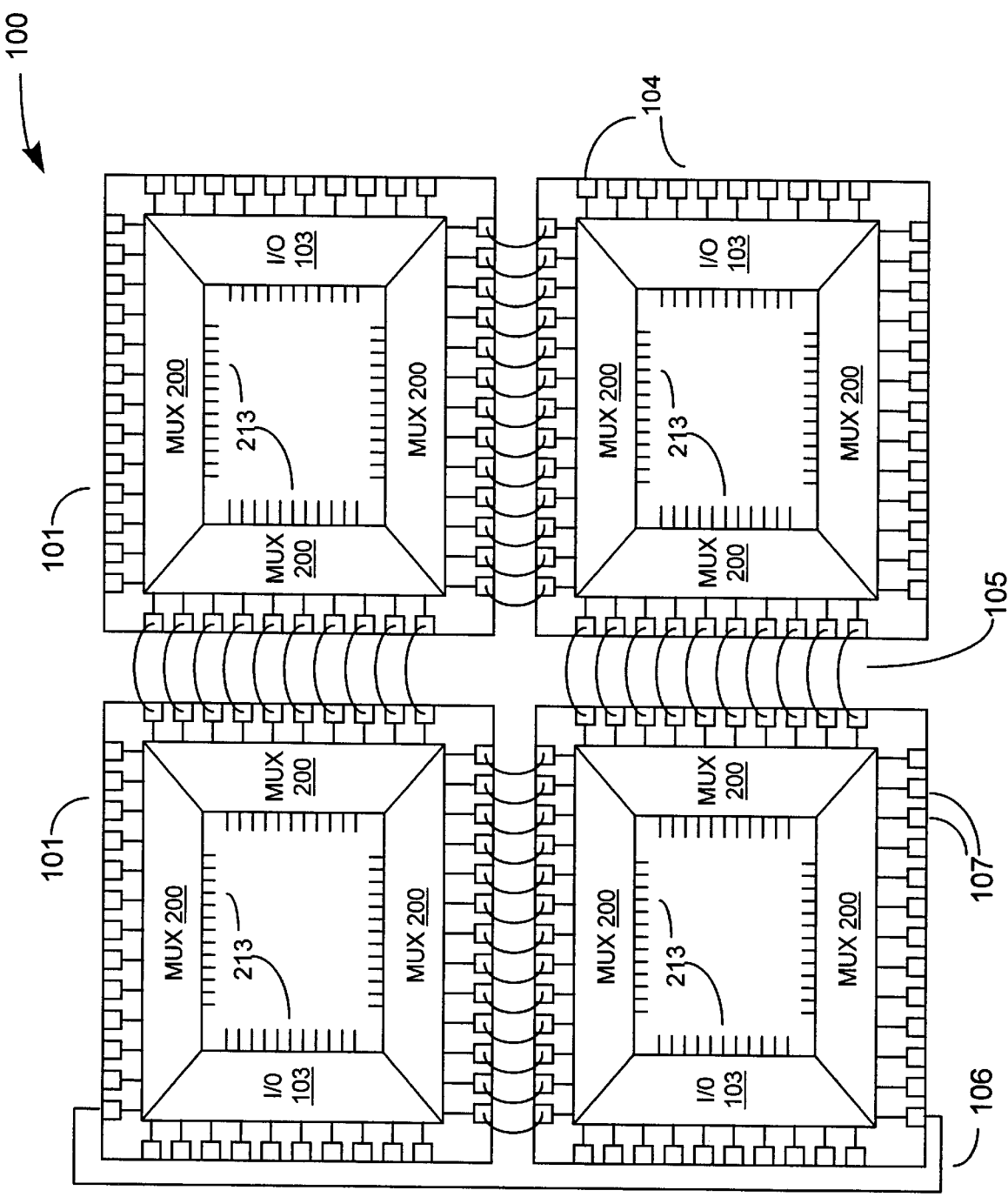
FIG. 1 is a block diagram illustrating a multiple chip circuit employing the I/O multiplexing in accordance with the present invention.

Programmable circuitry such as field programmable gate arrays (FPGAs) 101 in FIG. 1 have a large demand for input/output (I/O) channels into the chip. In order to provide large gate counts, there is a trend towards using multiple FPGA chips 101 to emulate larger systems. Multiple chip FPGA solutions require more I/O bandwidth than do conventional IC's. The present invention was designed for use in a multi-chip module (MCM) 100 comprising a number of FPGAs 101 shown in FIG. 1. However, it is contemplated that the teachings of the present invention have applicability for inter-chip communications beyond FPGA circuits.

As shown in FIG. 1, multiple chip circuit 100 requires the plurality of FPGA chips 101 to be coupled together by some arrangement of wire bonds 105 between bond pads 107 of adjacent (and occasionally non-adjacent) FPGA chips 101. The multiplexed bond pads 107 in accordance with the present invention can be mixed on circuit with non-multiplexed (i.e., conventional) bond pads 104. Although not illustrated in FIG. 1, conventional bond pads 104 were mixed on the three sides of chip 101 with multiplexed bond pads 107 while the fourth side had only conventional bond pads 104. These conventional bond pads 104 served to carry supply voltage, reference voltages and ground connections. In a particular test structure, an FPGA chip 101 used 180 multiplexed bond pads 107 on each of two sides of an FPGA chip 101 out of a total of 241 bond pads available on each side. A total of 192 multiplexed bond pads 107 were used on one other side of the example structure out of a total of 257 available bond pads. A final side of the example FPGA 101 used only conventional bond pads 104 to enable communication with external circuitry that uses conventional non-multiplexed binary signals. The pitch at which bond pads 107 and 104 can be formed is substantially less than the wiring pitch for wiring formed on FPGA 101. In the test structure, a state-of-the-art 1.2 mil wire-bond pitch was used with a spacing between adjacent FPGA chips 101 of 85 mils.

A major advantage of the present invention is to allow each wire 105 between FPGAs 101 to carry more than one signal simultaneously so as to effectively double the number of wires. This is accomplished in accordance with the present invention by encoding two binary signals from two on-chip wires 213 into a single quaternary signal that is supplied to multiplexed bond pads 107. The quaternary signal is coupled across a single wire bond 105 to a receiving FPGA 101. Receiving FPGA 101 decodes the quaternary signal into two binary signals and couples the two binary signals to two selected on-chip wires 213. Hence, the two binary signals are transported in the same direction at the same time between adjacent FPGAs 101 across a single wire 105.

The multiplexed chip I/O in accordance with the present invention provides adequate noise margin such that the quaternary signal can be conducted at the same speed as a binary signal. Hence, the multiplexed I/O in accordance with the present invention provides true doubling of capacity for each wire. The quaternary signal comprises four possible voltage states spaced between the ground and upper power supply voltage for the IC. In the preferred embodiment, the upper supply voltage is approximately 3.3 volts, hence the logic signals comprise 3.3V, 2.2V, 1.1V and 0.0V. This arrangement provides the required noise margin between states to allow accurate discrimination by the receiving FPGA 101.

To support rich configurability demanded by FPGA users, each multiplexed bond pad 107 is desirably configurable to either transmit and receive the quaternary signal. Although in the preferred embodiment, each multiplexed bond pad 107 is configured during programming to either transmit or receive, it is necessary that the bond pad multiplexing circuitry (200 shown in FIG. 2) be capable of performing both functions.

2. Binary signal Multiplexing and Demultiplexing

Figure 2:
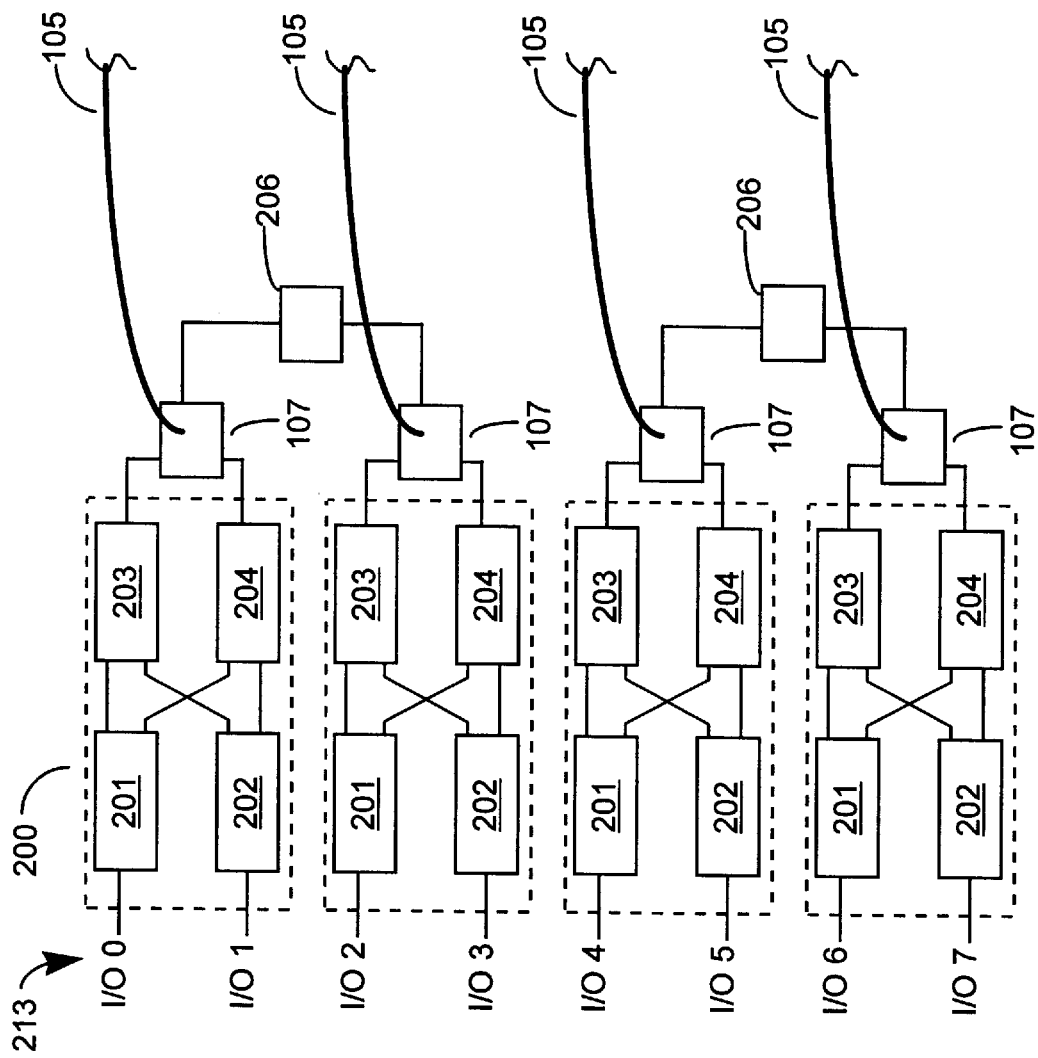
FIG. 2 is a block diagram of a portion of one chip shown in FIG. 1.

FIG. 2 illustrates an enlarged, simplified view of an edge portion of one FPGA 101 having multiplexed bond pads 107 in accordance with the present invention. For convenience, the on chip wires 213 are labeled I/O 0 through I/O 7, but it should be understood that any number of I/O wires 213 may be used in accordance with the teachings of the present invention.

Each multiplexing circuit 200 is coupled to a pair of bi-directional on-chip wires 213. Multiplexing circuit 200 serves to convert two binary output signals appearing, for example, on lines I/O 0 and I/O 1 into a single quaternary output signal applied to multiplexed bond pad 107. Multiplexor circuit 200 also provides a demultiplexing function by converting a quaternary signal on multiplexed bond pad 107 into a binary signal on wires I/O 0 and I/O 1. The detailed functioning of multiplexor 200 including bi-directional buffers 201 and 202 as well as transmit circuit 203 and receive circuit 204 are described in greater detail in reference to the other figures.

Each pair of multiplexed bond pads 107 are desirably coupled by a programmable pass circuit that can short two multiplexed bond pads 107 together. This optional feature of the present invention is used to test functionality of the multiplexing circuitry 200. For example, a first of the two multiplexor circuits 200 can be configured as an output (i.e., transmit circuit 203 active) and a second multiplexor circuit 200 configured as an input (i.e., receive circuit 204 active). By programmably shorting the two multiplexed bond pads 207, test signals can be routed out through one bond pad and into another to be captured and/or verified by circuitry internal to FPGA 101. This allows functionality testing at wafer level or die level using fewer probe needles to contact FPGA 101 before the final assembly and wire bonding of an MCM 100.

Figure 3:
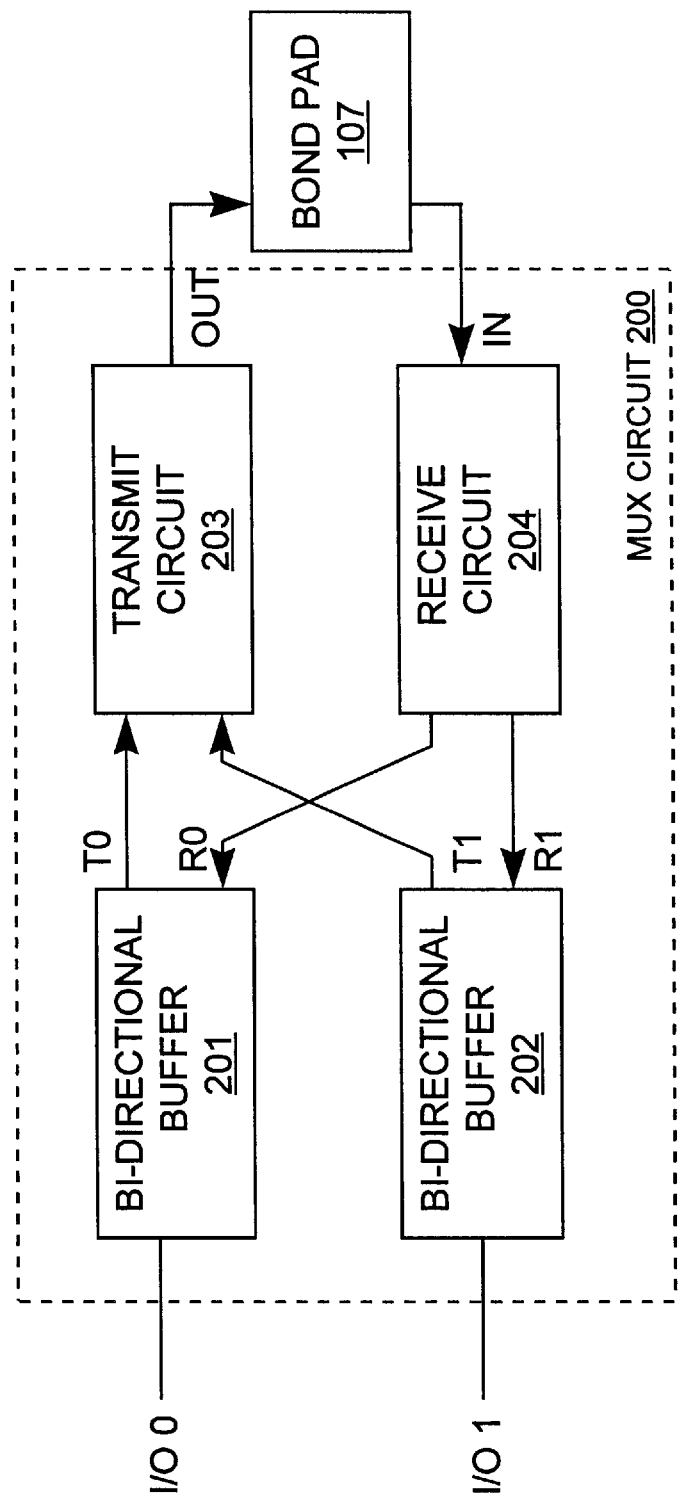
FIG. 3 is an enlarged block diagram of a single bond pad and associated multiplexing circuitry.

Referring now to FIG. 3, a first of the wires 213, I/O 0 entering each multiplexor 200 is coupled to a bi-directional buffer 201 while a second wire I/O 1 is coupled to bi-directional buffer 202. Bi-directional buffers 201 and 202 are substantially similar and comprise conventional buffer circuitry. Desirably, buffers 201 and 202 have a logic threshold matched to the input signal swing generated by on-chip wires 213 by the internal circuitry of FPGA chips 101. Also, buffers 201 and 202 desirably include feedback circuitry to stabilize their output when the on-chip wires 213 are floating.

Bi-directional buffer 201 generates a binary T0 output coupled to transmit circuit 203 when multiplexor circuit 200 is configured as an output. Bi-directional buffer 202 generates a binary T1 output when multiplexor circuit 200 is configured as an output. Bi-directional buffer 201 receives a binary R0 signal from receive circuit 204 and bi-directional buffer 202 receives a binary R1 signal from receive circuit 204 when multiplexor 200 is configured as an input. Hence both binary signals must be moving in the same direction (i.e., either an input or an output) at the same time.

Multiplexor circuit 200 is configured or programmed to activate either the receive circuit 204 or the transmit circuit 203 during configuration of FPGA 101. Configuration is accomplished by loading configuration information into storage registers (not shown) within multiplexor circuit 200 using any available FPGA programming technology. It is contemplated that the configuration of multiplexor circuit 200 can be changed during operation of the circuit design emulated in FPGA 101, however, self-configuring or reconfiguring circuitry is not included in the preferred embodiment.

3. Transmit Circuit

Figure 4:
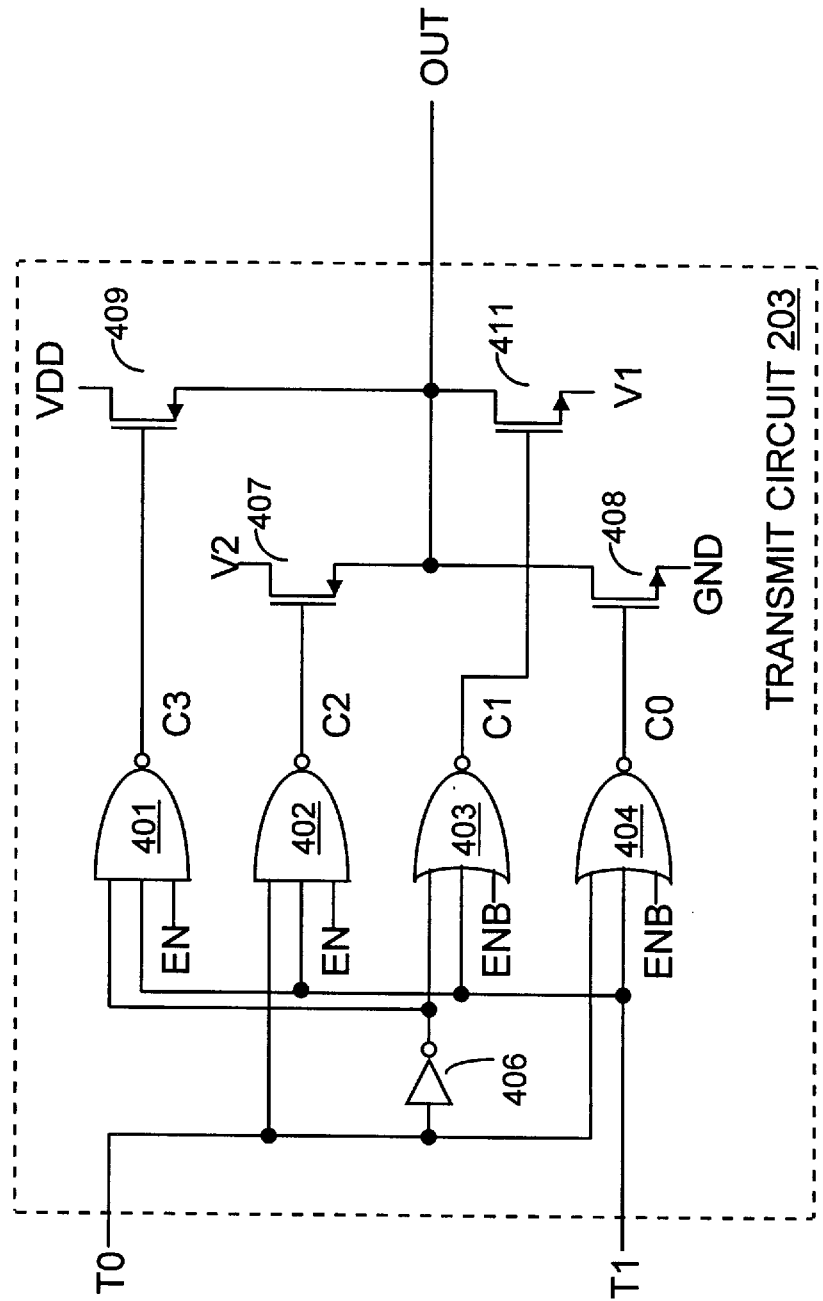
FIG. 4 show a transmitter circuit in accordance with the present invention.

Transmit circuit 203 in accordance with a preferred embodiment of the present invention is shown in FIG. 4. Transmit circuit 203 is essentially a simple digital to analog converter that produces one of four analog voltage levels on the OUT line in response to two binary input signals on T0 and T1. Transmit circuit 203 accept two binary inputs T0 and T1 as well as an enable input labeled EN in FIG. 4. The ENB signal in FIG. 4 is generated by inverting the EN signal and can be generated within transmit circuit 203 or externally where the EN signal and ENB signal are used by other circuit components. Transmit circuit 203 uses gates 201–204 to generate a series of intermediate signals C0–C3. Intermediate signals C0–C3 are control inputs to gates of transistors 407–409 and 411 to produce a single quaternary output.

The enable signal EN is coupled so that when it is disabled (i.e., logic low) the OUT line is in a high impedance state. It can be seen that a low EN (and corresponding high ENB) will turn all of transistors 407–409 and 411 off to generate the desired high impedance state. The OUT line in FIG. 4 is coupled to multiplexed bond pad 107 shown in FIG. 1 through FIG. 3. In addition to the high impedance state, transmit circuit generates a four level signal where the first level is 0.0 volts or ground, the second level is 1.1 volts generated by the V1 supply, the third level is 2.2 volts generated by the V2 supply, and the fourth level is 3.3 volts generated by the VDD supply. Table 1 shows a truth table for the function realized an bond pad 107.

TABLE 1

| EN | T0 | T1 | Bond Pad 107 |
|----|----|----|--------------|
| 0  | X  | X  | hiZ          |
| 1  | 0  | 0  | GND          |
| 1  | 0  | 1  | VDD          |
| 1  | 1  | 0  | V1           |
| 1  | 1  | 1  | V2           |

4. Receive Circuit

Figure 5:
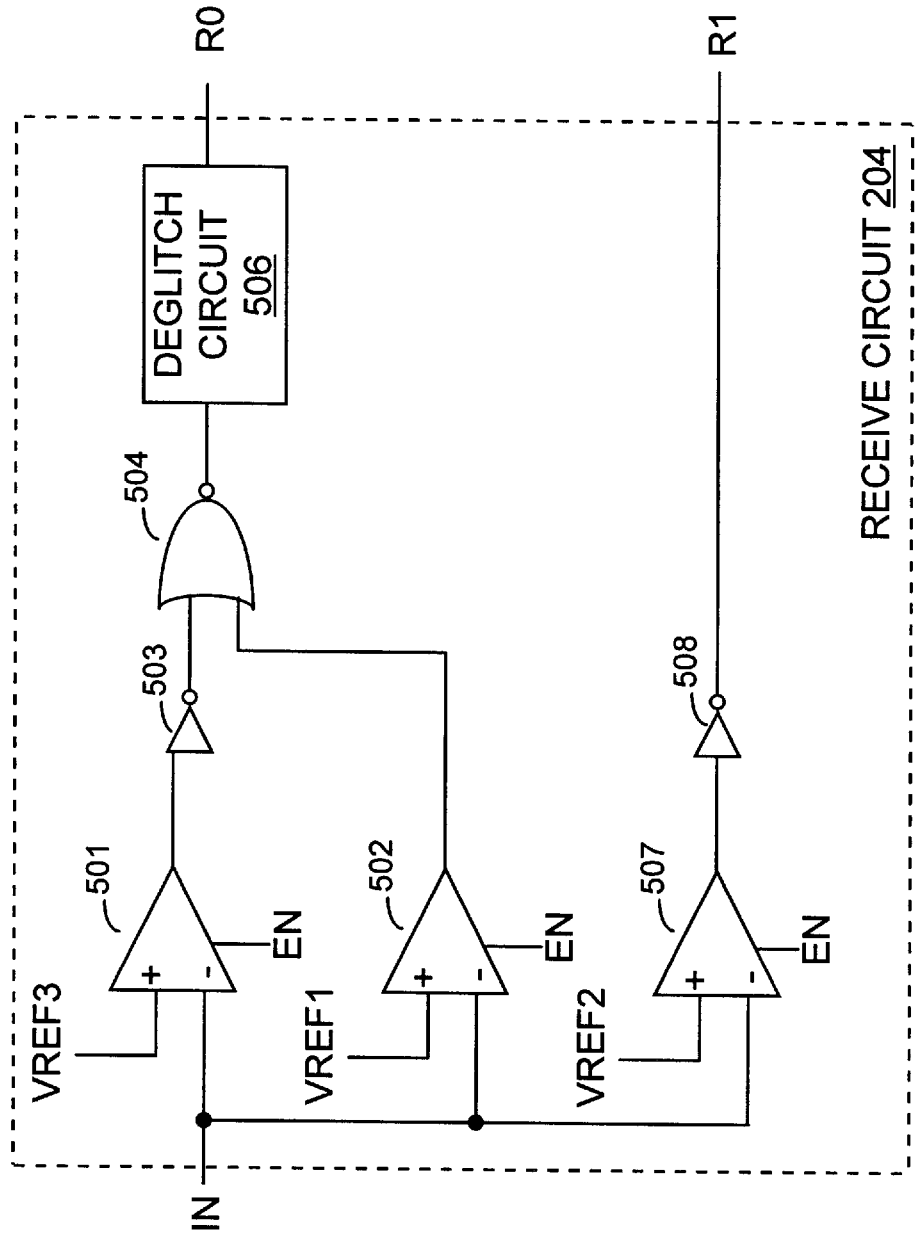
FIG. 5 shows details of a receiver circuit in accordance with the present invention.

Receive circuit 204 in accordance with a preferred embodiment of the present invention is illustrated in FIG. 5. Receive circuit 204 is essentially an analog-to-digital converter that receives a single analog signal having four discrete levels and converts the analog signal to two binary digital signals on the R0 and R1 lines. Receive circuit 204 must recognize the same quaternary signals as are generated by transmit circuit 203. Hence, the truth table for the output of receive circuit 204 is identical to Table 1 above.

As shown in FIG. 5, receive circuit 204 is implemented by three comparator circuits 501, 502, and 507. Comparator 501 compares the input signal from multiplexed bond pad 107 to VREF3, a DC voltage that is used to detect a logic signal with a nominal value of VDD. In a particular example, VREF3 is set to 2.75V and is regulated to within ±1%. Hence, comparator 501 will generate a logic high output until the IN signal increased above 2.75 volts. The output of comparator 501 is coupled through inverter 503 to an input of NOR gate 504.

Comparator 502 generates a logic high signal until the IN signal increased above VREF1 which is set at 0.55 volts±1% in the particular example. The output of comparator 502 is coupled to an input of NOR gate 504. NOR gate 505 generates the R0 data signal, however, it has been found that certain transitions of the quaternary signal may affect the accuracy of the R0 signal for some finite time after the transition. Hence, deglitch circuit 506 is coupled to delay the R0 output from changing until this finite time has passed. The R1 signal has not exhibited this property.

Figure 6:
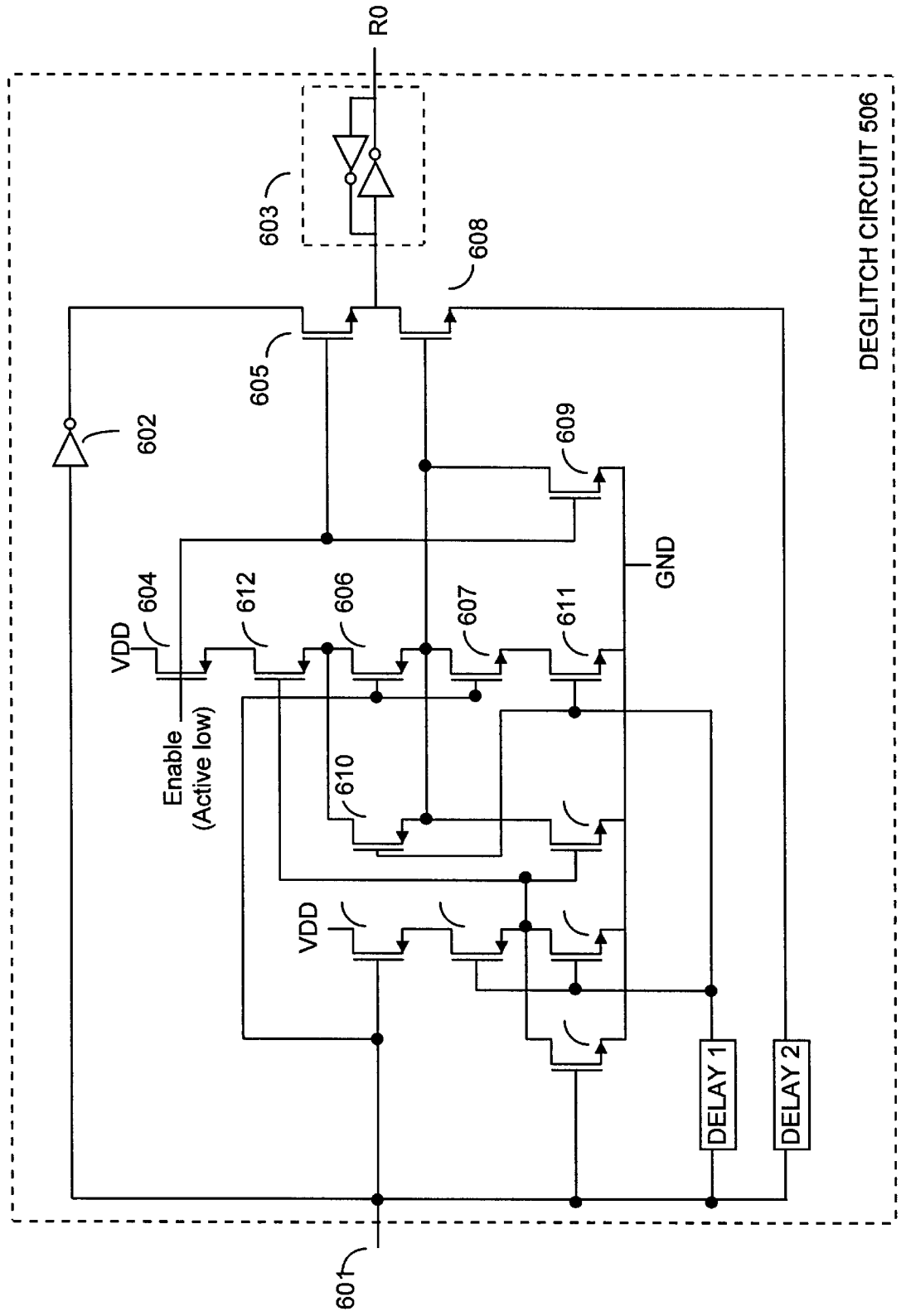
FIG. 6 shows deglitch circuitry of FIG. 5.

FIG. 6 illustrates an example circuit for implementing deglitch circuit 506 shown in FIG. 5. The particular example shown in FIG. 6 and described herein is provided for example only and is not a limitation on the broader teachings of the present invention. Skilled circuit designers will be able to implement variations and functional equivalents to the particular example given using circuits that differ somewhat or even substantially from the particular example. These modifications and variations are considered equivalent to the particular example described herein.

Deglitch circuit 506 is coupled to the output of NOR gate 504 (shown in FIG. 5) at line 601. The signal on line 601 is essentially the raw R0 output that is coupled to, among other things, a DELAY 1 line and a DELAY 2 line to produce first and second delayed signals. Line 601 is also coupled directly through inverter 602 to a drain of transistor 605. Transistor 608 is source-coupled to the delayed R0 signal from DELAY2.

Transistors 605 and 608 serve together to select either the delayed R0 or the raw R0 for output. This selection is determined by the circuitry coupled to the control inputs or gates of transistors 605 and 608. The selected signal is applied to latching buffer 603 that inverts the signal and applies the inverted signal to the R0 line shown in FIG. 5. Latching buffer 603 provides sufficient feedback to inhibit a change in state on the R0 line until one of transistors 605 and 608 is sufficiently activated to overcome the feedback. Hence, if both transistors 605 and 608 are inactive, R0 will not change state even though the input to latching buffer 603 is floating.

An ENABLE signal (not shown in FIG. 5) is applied directly to the gate of transistor 605. The ENABLE signal is externally applied from, for example, user supplied configuration data stored in on-chip memory. When the ENABLE signal is logic high, transistor 605 is conductive and raw R0 signal is coupled through inverter 602 and latching buffer 603 to R0. Also, a logic HIGH ENABLE signal activates transistor 609 to ground the control input of transistor 608 and prevent selection of the delayed R0 signal. Hence, the ENABLE signal allows deglitch circuit 506 to be programmably bypassed so that R0 is the same as the raw signal applied to line 601. This feature is useful to reduce the propagation delay associated with receiver circuit 204 in applications in which do not encounter problems without deglitching.

When ENABLE is logic low, transistors 605 and 609 are deactivated to decouple the raw signal on line 601 from latching buffer 603 and to enable the control input to transistor 608 by activating transistor 604. It is important to note that transistor 608 is not activated by a LOW ENABLE signal. The remaining circuitry in deglitch circuit 506 serves to compare the raw R0 signal on line 601 to the delayed R0 signal generated by DELAY 1. When both these signals are the same, the control input to transistor 608 is held low and R0 cannot change. From this steady state condition, when the raw signal on line 601 next changes, the control input to transistor 608 is activated for a period of time equal to DELAY 1. During this time period, the delayed output from DELAY 2 is considered valid and is coupled through transistor 608 to latching buffer 603. DELAY 2 is slightly longer than DELAY 1, so that the function of deglitch circuit 506 is to allow a transition of R0 only at a time when the raw signal on line 601 is not in transition. The actual values of DELAY 1 and DELAY 2 can be selected to provide any desired delay between a signal transition and a valid transition of R0.

The example circuit shown in FIG. 6 uses conventional notation to indicate circuit components and connections and need not be discussed in greater detail herein to understand the concept of the present invention. Any equivalent circuit can be manufactured using more or less transistors or other types of switching and logic devices to meet the needs of a particular application.

5. Results and Conclusion

In the specific example, the four discrete levels of the analog or quaternary signal are separated by 1.1V with a full scale swing of 3.3V. Using simulation software to estimate a worst case scenario, the estimated total noise was slightly below 55 mV with signal transitions in the neighborhood of 100 MHz.

By now it is appreciated that a multiplexed I/O architecture is provided that transmits two binary signals simultaneously over single wire. The details of the specific examples illustrated and described in accordance with the preferred embodiments are provided for completeness only, and are not considered limitations on the teachings of the present invention. Accordingly, the many modifications of the specific implementation including the modifications expressly suggested herein are equivalent to the preferred embodiments described herein.

We claim:

1. An electrical interconnect between a plurality of output nodes of a first integrated circuit (IC) and a plurality of input nodes of a second IC, the interconnect comprising:

a first bond pad located on the first integrated circuit;

a second bond pad located on the second integrated circuit;

a first digital-to-analog converter located on the first integrated circuit and having an output coupled to the first bond pad and receiving a plurality of binary inputs from the output nodes of the first integrated circuit;

a first analog-to-digital converter located on the second integrated circuit and coupled to the second bond pad and having an output line coupled to each of the plurality of input nodes of the second IC.

2. The interconnect of claim 1 further comprising:

a de-glitch circuit integrated with the analog-to-digital converter that inhibits change on any of the plurality of input nodes for a preselected time after a signal change occurs on the second bond pad.

3. The interconnect of claim 1 further comprising:

a second digital-to-analog converter located on the second integrated circuit and having an output coupled to the second bond pad and receiving a plurality of binary inputs from output nodes of the second integrated circuit;

a second analog-to-digital converter located on the first integrated circuit and coupled to the first bond pad and having an output line coupled to each of a plurality of input nodes of the first IC.

4. The interconnect of claim 1 wherein the plurality of binary inputs on the second IC comprise two binary inputs and the digital-to-analog converter is a two-bit digital-to-analog converter.

5. A field programmable gate array (FPGA) integrated circuit (IC) chip adapted to be used in a multi-chip circuit comprising:

a plurality of programmable logic devices formed on the FPGA IC;

an interconnect bus comprising a plurality of wires formed on the chip and coupling to the programmable logic devices;

a plurality of multiplexed bond pads formed on the chip; and a multiplexor circuit coupled to each multiplexed bond pad, the multiplexor circuit coupled to at least two wires of the interconnect bus, wherein the multiplexor circuit is programmable to convert binary data signals on the at least two wires to quaternary data on the multiplexed bond pad and to convert quaternary data on the multiplexed bond pad to binary data on the at least two wires.

6. The FPGA IC of claim 5 further comprising:

a plurality of non-multiplexed bond pads formed on the chip.

7. The FPGA IC of claim 5 wherein the multiplexor circuit comprises:

first, second, third, and fourth direct current voltage sources;

a transmit circuit for receiving a binary signal from each of the at least two wires and selectively coupling one of the four voltage sources to the multiplexed bond pad in response to the binary signals; and a receive circuit for receiving a quaternary voltage signal on the multiplexed bond pad, comparing the received signal to three reference voltages, and generating a binary output on each of the at least two wires in response to the comparison.

8. The FPGA IC of claim 5 further comprising a programmable electrical short coupling a first multiplexed bond pad and a second multiplexed bond pad.

9. A method for communicating binary signals on separate lines in a first integrated circuit (IC) to separate lines in a second IC comprising the steps of:

encoding on the first IC at least two of the binary signals on the separate lines in the first IC into an analog voltage signal comprising a number of discrete voltage levels;

coupling the encoded analog voltage signal from the first IC to the second IC using a conductive link; and decoding the analog voltage signal on the second IC to regenerate the at least two binary signals onto the separate lines in the second IC.

10. The method of claim 9 wherein the at least two binary signals are encoded, coupled, and decoded substantially simultaneously.

11. The method of claim 9 wherein the number of discrete voltage levels is four.

12. An integrated circuit (IC) having a multiplexed output comprising:

a bond pad located on the integrated circuit;

at least two wires on the IC for carrying data signals;

a voltage multiplexor located on the IC and receiving the at least two wires as inputs and outputing a multiplexed signal on the bond pad;

a voltage demultiplexor located on the IC and receiving a multiplexed signal on the bond pad and having an output line coupled to each of the at least two wires of the IC;

a selector circuit accepting an external control input and enabling either the voltage multiplexor or the voltage demultiplexor in response to the external control input;

a de-glitch circuit coupled to the output of the voltage demultiplexor that inhibits voltage change on the at least two wires for a preselected time after a signal change occurs on the bond pad.

13. The IC of claim 12 further comprising:

a programmable by-pass of the de-glitch circuit coupling the voltage demultiplexor output directly to the at least two wires.

* * * * *